United States Patent [19]
Withers et al.

[11] Patent Number: 5,276,398
[45] Date of Patent: Jan. 4, 1994

[54] SUPERCONDUCTING MAGNETIC RESONANCE PROBE COIL

[75] Inventors: Richard S. Withers, Sunnyvale; Guo-Chun Liang, Cupertino, both of Calif.

[73] Assignee: Conductus, Inc., Sunnyvale, Calif.

[21] Appl. No.: 929,900

[22] Filed: Aug. 11, 1992

Related U.S. Application Data

[63] Continuation-in-part of Ser. No. 891,591, Jun. 1, 1992.

[51] Int. Cl.$^5$ .............................. G01V 3/00
[52] U.S. Cl. .................. 324/318; 324/322; 505/844
[58] Field of Search .......... 324/318, 322, 307, 309, 324/300; 505/844, 866, 705

[56] References Cited

U.S. PATENT DOCUMENTS

| | | | |
|---|---|---|---|
| 4,636,730 | 1/1987 | Bottomley | 324/318 |
| 4,981,838 | 1/1991 | Whitehead | 505/866 |

FOREIGN PATENT DOCUMENTS 64-1208  1/1989  Japan .................. 505/705

*Primary Examiner*—Louis Arana
*Attorney, Agent, or Firm*—Kimberley Elcess; James J. Leary

[57] ABSTRACT

A magnetic resonance probe coil is fabricated using a superconductive material for the coil. Three distinct embodiments are described: a single-layer coil with no crossovers; a dual-film coil wherein the capacitors are formed through an intermediate dielectric layer; a single-layer coil incorporating a superconducting crossover. All of the embodiments are designed to take advantage of the properties of the superconducting material to achieve very high quality factors (Q) of tens of thousands to over a million. The superconductor is patterned into a spiral design to achieve self-resonance at a desired frequency in the range of 1 to 1000 MHz and the device operates at temperatures higher than 30 K. A broadband matching network is also disclosed which, when operated in conjunction with the superconducting magnetic resonance probe coil, allows operation over a wide range of frequencies while maintaining extremely low loss.

21 Claims, 8 Drawing Sheets

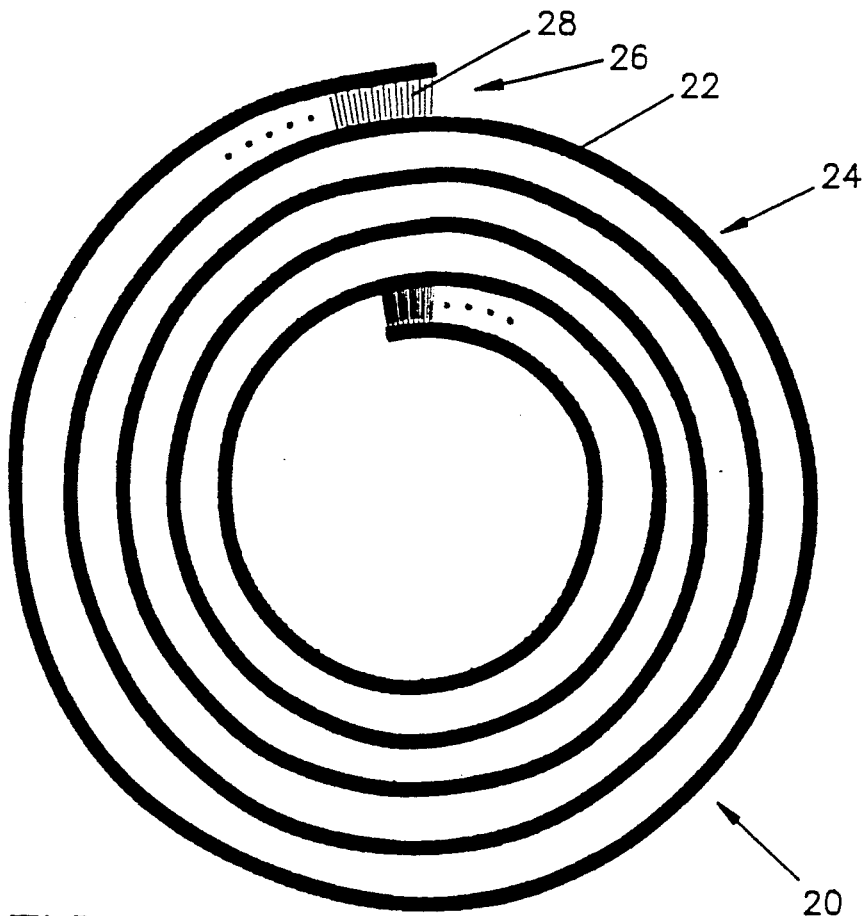
FIG. 1
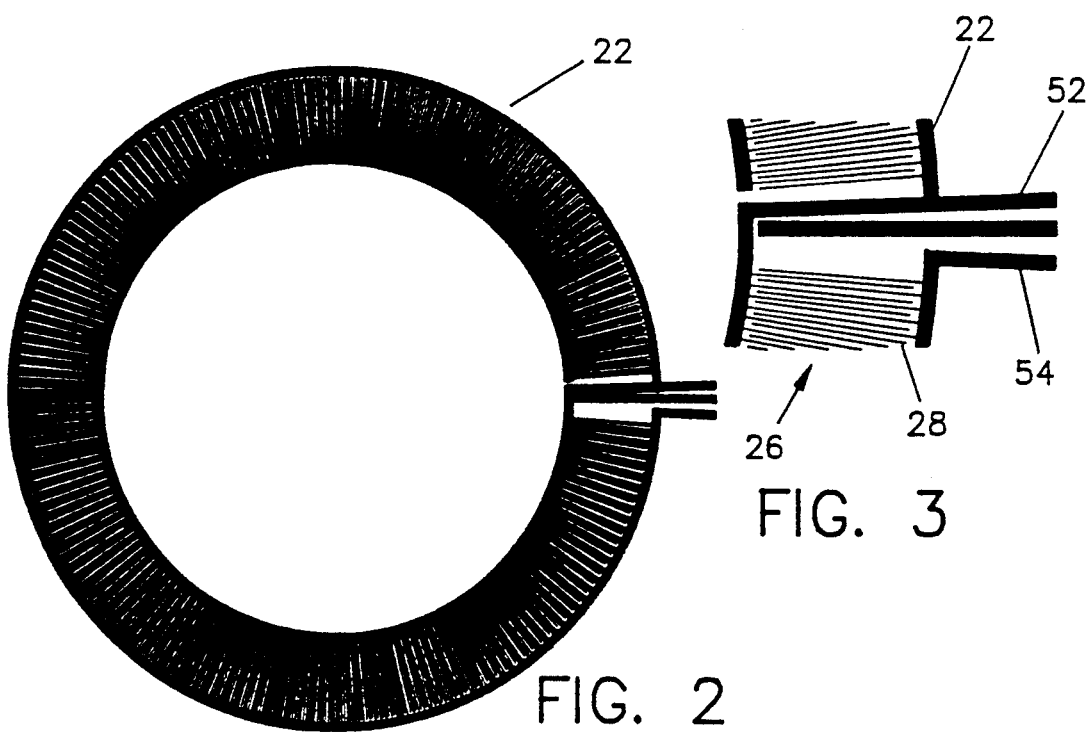
FIG. 2
FIG. 3 fc= 18.5435 MHZ  SWEEP= 10 KHZ

SUPERCONDUCTING MAGNETIC RESONANCE PROBE COIL

CROSS-REFERENCE TO RELATED APPLICATIONS

This application is a continuation-in-part of U.S. patent application Ser. No. 07/891,591 by Richard S. Withers and Guo-Chun Liang filed Jun. 1, 1992.

FIELD OF THE INVENTION

This invention relates to a superconducting magnetic probe coil used to detect magnetic resonances. More particularly, it relates to designs for a superconducting coil suitable for use as a detector in a magnetic resonance imaging system for medical or other applications.

BACKGROUND OF THE INVENTION

For certain applications, it is desirable to have a magnetic loop sensor, tuned by the addition of capacitance to resonate in the frequency range of 1-1000 MHz. In order to detect very weak magnetic fields such a sensor must generate extremely low levels of noise and consequently must have extremely low resistance and hence low loss. The lowest loss sensors are made of superconductor materials. Until recently, all superconductor materials had to be cooled below 30 K. to operate as superconductors. This requirement added significantly to the cost and complexity of systems which relied on these materials. The sensor design described here is one appropriate to high temperature superconductors, i.e., superconductor materials whose superconducting transition temperature (critical temperature or $T_c$) is higher than 30 K. This latter class of materials, also known as cuprates, oxide superconductors and perovskites, is better suited to use in thin film form than in bulk forms. This physico-chemical difference necessitates new device and circuit designs to make these materials useful in superconducting applications. The design can also be fabricated using conventional superconductors, like niobium, which are available in thin film form.

For certain magnetic resonance imaging (MRI) applications, resonant frequencies of approximately 5 MHz and sufficiently low resistance that the coil has a resonant quality factor (Q) of not less than $10^4$, and even as high as $10^6$, are desired. The low resistances implied by these high values of Q ensure that the coil's internally generated thermal noise will be less than the noise generated by other noise sources within the imaging system, such as the tissue or object being imaged or the preamplifier coupled to the coil. To achieve such high Q, it is necessary that the equivalent series resistance of the LC resonator be less that approximately 100 $\mu\Omega$ to 1 m$\Omega$. Such low resistance is achieved by the use of superconducting thin-film metallization in both the coil and the capacitor. A key advantage of this approach is that the sensor can be produced with a single superconductive film, and as a result it is more easily and reproducibly manufactured.

Several embodiments of this invention are disclosed herein. One embodiment of this invention consists of a multi-turn spiral coil (having inductance L) with an internal distributed interdigital capacitor (having capacitance C). The device operates in a self-resonant mode. One variation of this design has no connection between the inner end of the inductor coil and its outer end. Such a configuration is possible to fabricate in a single layer of superconductor with no crossover, that is, with no intervening dielectric layer.

An alternative design employs a single turn of interdigitated capacitor and has a crossover connection between the inner end of the inductor spiral and its outer end. This embodiment consists of a multi-turn spiral coil (having inductance L) connected to a surrounding interdigital capacitor (having capacitance C). It is useful for certain magnetic-resonance-imaging (MRI) applications, employing resonant frequencies of approximately 5 MHz, having an inductance of the order of 1 $\mu$H, and an equivalent series of 1 m$\Omega$ or less. The corresponding resonant quality factors (Qs) are $10^4$ to $10^6$. Such low loss is achieved by the use of superconducting thin-film metallization in both the coil and the capacitor. Even the crossover (which connects to the inside end of the spiral coil and crosses over the other turns of the coil to reach one terminal of the capacitor) must be superconducting, which is achieved by the use of two thin films of superconductor with an intervening layer of insulating thin film. This design has a higher effective capacitance than does the single layer variant, which results in a lower resonant frequency. Because it does not require interdigital capacitors throughout the circuit, it can also be made with higher inductance than the single layer variant, allowing it to operate at lower frequencies at the expense of a crossover.

Other embodiments of the present invention employ two multi-turn spiral coils, placed in proximity to each other and with a sense of current flow such that their mutual inductance enhances their self inductances, coupled together by two annular capacitors at their inner and outer extremities in order to form a resonant circuit. Here the capacitance of the structure is increased in order to reduce the operating frequency. In these embodiments a key advantage is that the dielectric of the annular capacitors can be any suitable layer of material and can be made arbitrarily thin in order to reduce the resonant frequency.

DISCUSSION OF THE PRIOR ART

Previous resonant magnetic sensors for the detection of fields in the frequency range of 1 to 1000 MHz have been made using normal metals such as copper which are not superconducting. Because of the resistivity of copper, these sensors have been limited to resistances exceeding many m$\Omega$ and to quality factors of at most a few thousand. This is adequate for most applications, for example in MRI machines with very strong magnetic fields (approximately 1 Tesla or more), but not in applications in which the signal levels are low. Thin film versions of the sensors made with normal metals have even lower Qs, precluding the use of thin film technology.

This invention is different in that it uses superconducting materials to drastically improve the Q of the resonant sensor. High quality superconductors of the high temperature variety are most readily available in thin film (rather than bulk or wire) form. This requires a different physical design of inductor and capacitor than is used for a bulk, normal metal version. In the embodiment shown in FIG. 1, the inductor (which actually intercepts the magnetic signal) consists of a spiral of a few or several turns, and the capacitor consists of interdigitated combs distributed throughout the inductor. The spiral may be made of a true spiral, of spirally connected concentric circles, or of spirally connected line segments. The use of superconductive metallization is essential to achieving the low loss (and hence high Q) behavior of both the inductor and capacitor. Photolithographic techniques are utilized to pattern the circuit to dimensions of a few tens of micrometers, thereby precisely controlling the resonant frequency. Use of such techniques is not possible with the prior art bulk technology, nor is the prior art bulk technology applicable to these new high temperature superconductor materials.

While the embodiment of FIG. 1 shows a superconducting coil made from a single layer of superconductive material, it can also be advantageous to use a coil structure formed from two layers of superconductive material. When the two layers are separated by a dielectric layer the resonating capacitors of the device are formed through the dielectric layer by forming superconducting electrodes on opposite sides of the layer. Here the advantages of the superconductive material is preserved, while the design criteria for the capacitors are somewhat relaxed due to the more conventional geometry. For some applications it will be advantageous to fabricate two superconductive layers in order to enjoy more design flexibility for the capacitors.

OBJECTS AND ADVANTAGES

It is therefore an object of this invention to utilize a high temperature superconductor to obtain a very high quality factor magnetic resonance probe coil for use as a detector of small magnetic fields, either in medical applications or in other non-contact applications such as non-destructive evaluation (NDE). Not only does the use of a superconductor confer the advantage of low loss (high-Q) operation, but it offers a high Q in the relatively low frequency range, 1 to 1000 MHz, most useful for magnetic resonance imaging. The high critical temperature of the superconductor allows operation with much less stringent cooling requirements than earlier magnetic resonance detector systems, which were made with low critical temperature materials. Because earlier systems were unable to achieve the high quality factors of the current invention, very high magnetic fields were required for similar sensitivity. This necessitated the use of superconducting magnets, which were invariably cooled to less than 30 K. Such extreme cooling requirements resulted in large and ungainly systems in which the cooling subsystem was often larger than the detecting subsystem itself. The higher operating temperature of the current invention reduces the need for excessive real estate merely to house a refrigerator.

It is a further object of this invention to offer an easily manufacturable magnetic resonance probe coil. One embodiment, the interdigitated design, can be implemented in a single layer of superconducting material. It does not require two or more superconducting elements to pass each other without making electrical contact, and so it does not require the use of intermediate insulating layers. This elimination of a crossover reduces the number of required deposition steps to one, greatly increasing the manufacturing yield of the process. This design for manufacturability has never before been suggested for a magnetic resonance probe coil.

A second preferred embodiment, the dual-film design, also avoids a superconducting crossover, that is, an area in which two or more superconducting elements to pass each other without making electrical contact. In this design, two separate single layers of superconductive material are deposited, again profiting from simplicity of manufacturing. These layers are then placed on either side of an intermediate dielectric which can be chosen for optimal dielectric properties in this application, since there is no requirement for compatibility of the material with the superconductive layer or its processing steps. Furthermore, because the resonating capacitors are formed through the intermediate dielectric layer, the substrates onto which the superconductive layers are deposited need not have optimal dielectric properties since they are used only for mechanical support during crystal growth and subsequent processing.

Finally, a single layer design with a crossover is disclosed. This embodiment has a larger inductance, allowing it to operate at lower frequency. While the crossover adds processing complexity, the overall design remains simple and the lower frequency operation may be essential for some applications.

It is yet a further object of the invention to provide a broadened range of frequency of operation while maintaining acceptably low loss. The addition of a matching network, also made with superconducting material, allows operation over a frequency range up to 100 times the reciprocal of the quality factor of the probe coil, while adding only 13 dB of loss. It is the extremely small loss inherent in the superconducting coil and network that provide this flexibility.

SUMMARY

In brief, then, this application discloses a superconducting probe coil useful for detecting magnetic resonances in the 1 to 1000 MHz range. In one embodiment the coil is made from a single layer of high temperature superconductor, and operates at temperatures higher than 30 K. This coil is an interdigitated spiral and so does not require that the superconductor cross itself. Another embodiment employs two separately deposited layers of superconductor spaced apart by a dielectric layer. This coil also operates at temperatures above 30 K. and gives similar high-Q performance suitable for use in medical and other applications of low-signal MRI. Yet another embodiment is a coil with a crossover. The capacitor in this case is again interdigitated between turns of the inductive spiral, but here the digits are present only between the outer two turns of the spiral. The inner end of the spiral is then connected via a crossover to the outer end of the inductor.

We also disclose a superconductive matching network which couples the probe coil to an external preamplifier. This network broadens the bandwidth of the system by a factor of 100 or more while maintaining an acceptably low loss figure.

BRIEF DESCRIPTION OF THE DRAWINGS

FIG. 1 is a schematic view of a magnetic resonance probe coil with a five turn spiral inductor.

FIG. 2 is a schematic view of a magnetic resonance probe coil with a two turn spiral inductor made up of concentric arcs.

FIG. 3 is an enlargement of part of the probe coil of FIG. 2, showing more clearly the interdigitated capacitors.

FIG. 14(a) is the equivalent circuit showing explicitly the mutual inductance of the two superconductive layers. FIG. 14(b) is a further simplified equivalent circuit in which the mutual inductance and the self-inductances have been lumped as have all the capacitances.

FIG. 17(a) is a top view of the patterned superconductive layer while FIG. 17(b) is a schematic partial cross-sectional view.

DESCRIPTION OF THE PREFERRED EMBODIMENTS

Figure 4:
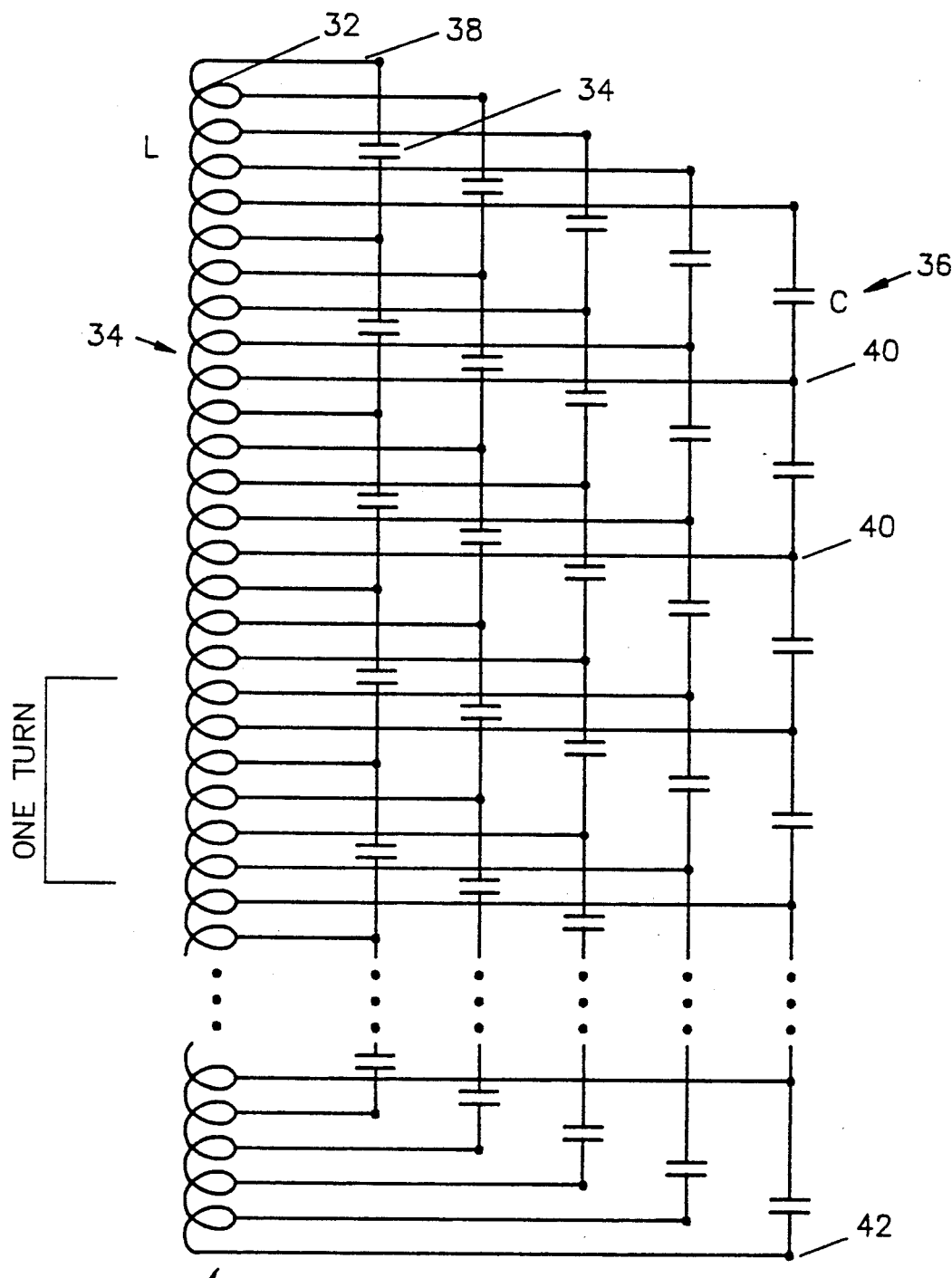
FIG. 4 is the equivalent circuit diagram of the probe coil, with some of the repeated intermediate elements left out for clarity.

The probe coil (20) of the first embodiment of this invention is illustrated in FIG. 1. The primary part of the resonant sensor is the spiral inductor (22), consisting of several turns of a superconducting film (24). These turns may be literally a spiral, or they may be concentric circles, slit over short parts of their circumference, and connected with primarily radial segments to effect a functional spiral, or they may even be straight line segments of decreasing length joined to effect a functional spiral. The particular embodiment illustrated in FIG. 1 is a spiral with five turns, while FIG. 2 shows a two-turn spiral made up of slit concentric circles.

Distributed throughout the inductor are interdigital capacitive elements (26). These elements may be formed, for example, by bringing narrow finger electrodes (28) from each turn of the spiral towards the neighboring turn(s) in an alternating fashion. An expanded view of these fingers can be seen in FIG. 3. A more conventional resonant probe coil configuration would use a separate inductor and capacitor. This conventional design would require a second layer of conductor to pass over the first layer without electrical connection. Because the second layer must in this application also be superconductive in order to not exceed the maximum allowable resistance, the structure would be much more difficult to produce. In the present invention a self-resonant mode of operation is achieved by distributing the capacitance throughout the inductance of the sensor coil.

Figure 5:
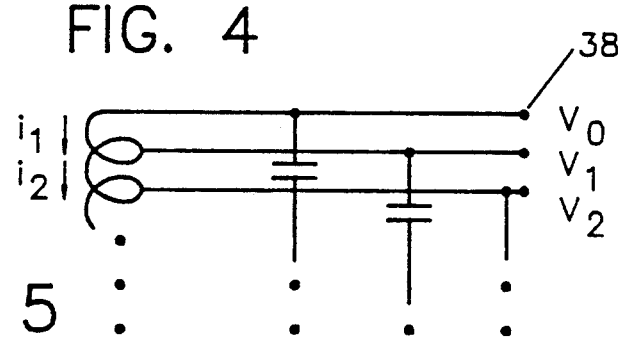
FIG. 5 is a detail of the equivalent circuit diagram of FIG. 4, showing some of the circuit parameters.

FIG. 4 is an equivalent circuit model of the invention. The spiral inductor (22) is represented by a single inductor (30), which is tapped at numerous points (32) by the elements (34) of the distributed capacitor (36). An expanded view of the first few elements can be found in FIG. 5. The first terminal (38) is at the top and is labeled $v_0$. The second terminal (40) of each elemental capacitor (34) is connected to another tap (32) on the inductor (30). In all cases the separation of the taps (32) to which a given elemental capacitor (34) is connected corresponds to one turn of the inductor (22). The last terminal (42) is at the bottom. The first and last terminals (38, 42) may be connected to a preamplifier (44) through a capacitor, or may be connected to nothing except by magnetic coupling.

The performance of the circuit can be analyzed by applying well known standard circuit theory to the equivalent circuit of FIG. 4, assuming a reasonable number of elemental capacitors (perhaps 10 to a few thousand). For the particular case in which there are N turns in the spiral, each turn having K interdigital capacitors (one per tap) of capacitance C, and all turns being approximately the same diameter so that all tap-to-tap-self-inductances L and mutual inductances M are approximately equal, the following difference equations apply:

$$v_p - v_{p-1} = -M d/dt \sum_{q=1}^{NK} i_q + M_{sample}\, d/dt\, i_{sample} + \quad (1)$$

$$\phantom{v_p - v_{p-1} = } M_{coup}\, d/dt\, i_{coup}$$

$$i_p - i_{p-1} = C d/dt (v_{p+K-1} - 2 v_{p-1} + v_{p-K-1}) \quad (2)$$

where the loop currents $i_p$ and node voltages $v_p$ ($0 \leq p \leq KN; i_0 = 0$; $v_p = 0$ for $p \leq 0$; $v_p = v_{KN}$ for $p > KN$) are as defined in FIG. 5. $M_{sample}$ and $M_{coup}$ are the mutual inductances between each loop element and the sample under examination and the preamplifier, respectively, and $i_{sample}$ and $i_{coup}$ are the currents in those elements. Note that, in FIG. 4, $K = 5$.

Also note that, for this ideal planar coil, $L = M = L_s/K^2$, where $L_s$ is the inductance of a single loop.

Clearly Equations (1) and (2) can be generalized for cases in which the C, M, and L values vary from tap to tap.

Making the usual sinusoidal steady state assumption of $v_p = \mathrm{Re}[V_p e^{j\omega t}]$ and $i_p = \mathrm{Re}[I_p e^{j\omega t}]$, where $V_p$ and $I_p$ are complex numbers and $j$ is $\sqrt{-1}$, one can rewrite (1) and (2) as $$V_p - V_{p-1} = j\omega \left[ -M \sum_{q=1}^{NK} I_q + M_{sample} I_{sample} + M_{coup} I_{coup} \right] \quad (3)$$

$$I_p - I_{p-1} = j\omega C[V_{p+K-1} - 2V_{p-1} + V_{p-K-1}] \quad (4)$$

Alternatively, one may convert the discrete model to a continuous one, obtaining differential equations (5) and (6) below which correspond to (3) and (4) respectively:

$$dV/dp = j\omega \left[ -M \int_{q=1}^{NK} I(q)dq + M_{sample} I_{sample} + M_{coup} I_{coup} \right] \quad (5)$$

$$dI/dp = j\omega CK \, d^2V/dp^2 \quad (6)$$

Equation (6) is valid only when there is no abrupt change between neighboring turns of the spiral; it is not accurate at the inner and outer turns of the probe coil. These two equations, however, make it clear (as do the corresponding difference equations) that the current is approximately constant along the length of the line, except at the inner and outer turns.

A further approximation provides more insight. Suppose that all capacitance in a single turn of the spiral is collected in a single lumped capacitance; this would be the case $K=1$ in the above analysis. The lumped element circuit of FIG. 6 results. For this circuit, with $L_p = M = L_s$, the single turn inductance, and $C_p = C$, the following difference equations for the complex amplitudes result:

$$V_p - V_{p-1} = j\omega[-M\Sigma I_q + M_{sample}I_{sample} + M_{coup}I_{coup}] \text{ for } 1 \leq p \leq N \quad (7)$$

$$I_p - I_{p-1} = j\omega C(V_p - 2V_{p-1} + V_{p-2}) \text{ for } 2 \leq p \leq N \quad (8)$$

and, at the end, $$I_1 = j\omega C(V_1 - V_0)$$

which can be applied to (8) to yield, by extension, $$I_p = j\omega C(V_p - V_{p-1}) \text{ for } 1 \leq p \leq N$$

From this equation, Equation (7) gives $$(1 - \omega^2 NCM)I_p = \omega^2 C[M_{sample}I_{sample} + M_{coup}I_{coup}] \quad (9)$$

From this it is clear that the current is constant along the length of the spiral and that the coil has a resonant frequency given by $$\omega_{res} = \omega_s/N^{0.5} \quad (10)$$

where $\omega_s = (MC)^{-0.5}$ is the single-turn resonant frequency.

A device has been designed using these principles and has been fabricated in a thin film of $YBa_2Cu_3O_{7-\delta}$ (YBCO) deposited on 5 cm-diameter $LaAlO_3$. The design is shown in FIG. 2. A single turn inductance of 0.1 $\mu$H and a lumped single turn capacitance (half of the total device capacitance) of 0.6 nF is expected for this two turn coil, from which Equation (10) predicts a resonant frequency of about 15 MHz. A more precise analysis based on fully distributed capacitance (and differential equations similar to Equations 5 and 6) predicts a resonant frequency of 20 MHz and a current distribution which is approximately sinusoidal, being zero at the ends of the spiral inductor and having a single maximum near the midpoint of the length of the coil. The fact that the current distribution is unidirectional (i.e., at a given moment in time, the current flow at all points in the inductor has the same clockwise or counterclockwise sense) is very important in maximizing the sensitivity of the coil to external fields. The realization that the fundamental self-resonant mode has this property is nonobvious; in fact, it is contrary to the advice given by experts in the field that self-resonant modes are not useful for this purpose because of non-unidirectional current flow.

Figure 6:
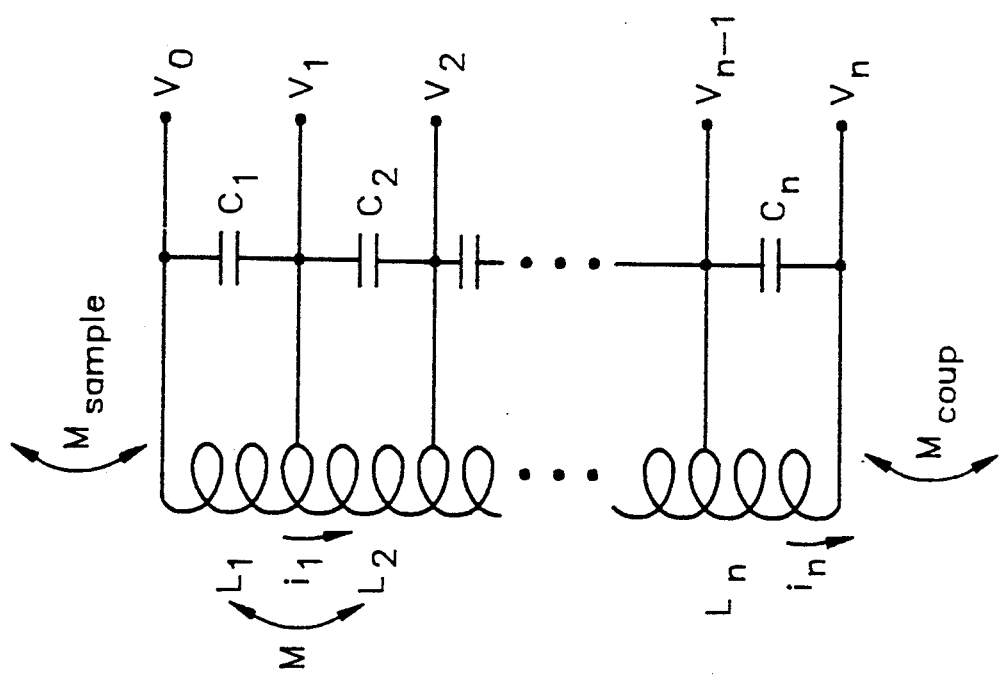
FIG. 6 is a simplified equivalent circuit diagram of the probe coil, where all of the capacitance of each turn is combined into a lumped capacitor.
Figure 8:
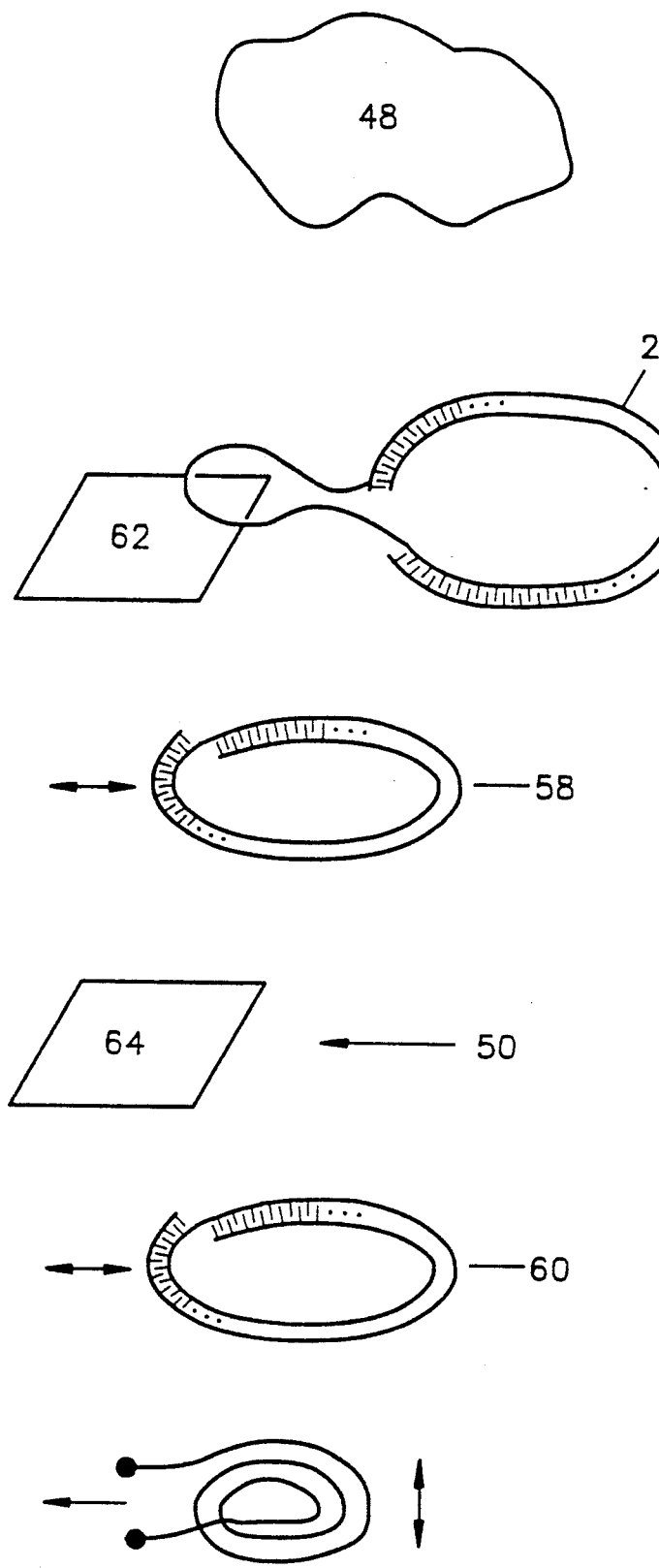
FIG. 8 is a schematic view of the operating configuration of the probe coil in conjunction with a broadband matching network coupled to a preamplifier.

In practice, the sensor would be placed near the source of magnetic signal, as shown schematically in FIG. 8. In an MRI application, this would be the object to be imaged (48). Transfer of the signals in the sensor to the signal processing, display, and recording systems may be achieved by an appropriate matching network (50). For example, ohmic contacts may be placed on the two terminals of the outer turn of the inductor (52, 54). Direct electrical connection may be made to these terminals through a capacitor of relatively low value, ensuring that the resonator is not excessively loaded, and the signals from the circuit applied to an appropriate low noise amplifier. Alternatively, coupling to the circuit may be achieved inductively (as shown in FIGS. 4, 6, and 8), perhaps to a small normal-metal coil which is external to the cryogenic enclosure of the circuit.

Figure 9:
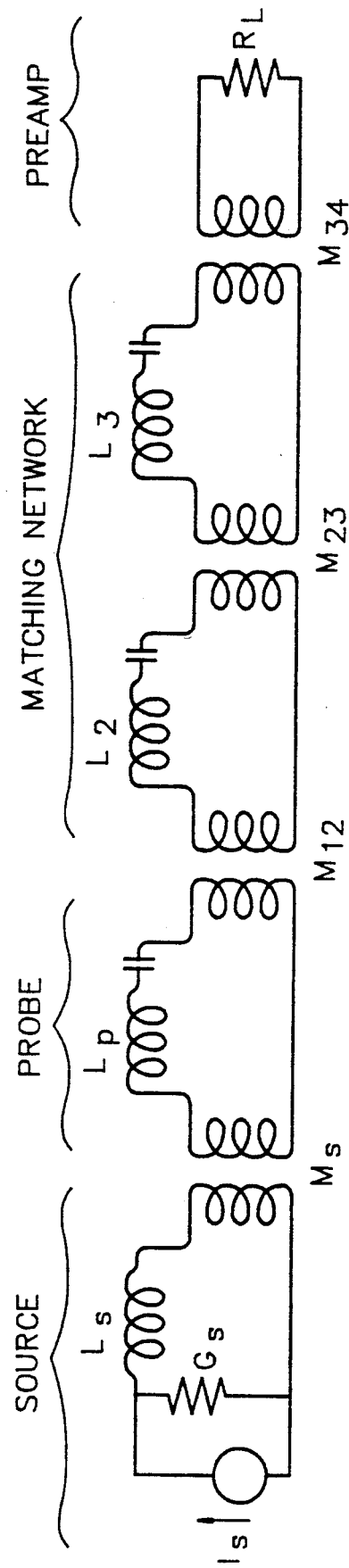
FIG. 9 is the equivalent circuit diagram of the matching network of FIG. 8.
Figure 10:
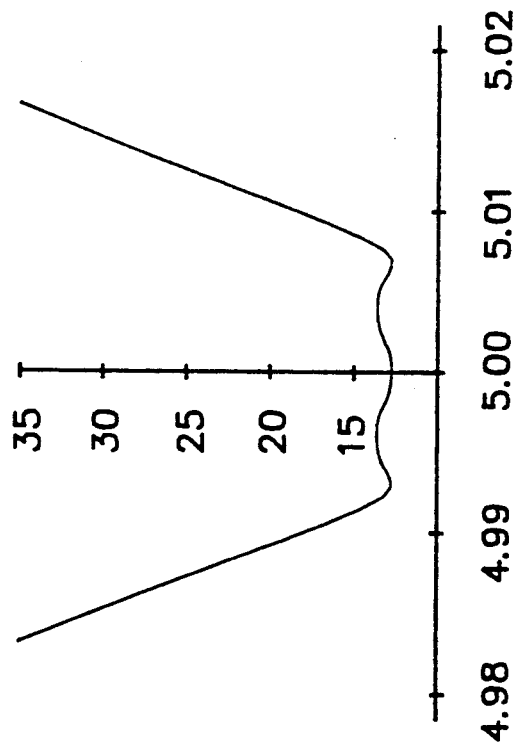
FIG. 10 shows the calculated bandwidth response of the matching network of FIG. 9.

The coupling schemes described above except for the one illustrated in FIG. 8 will yield a fractional coupling bandwidth of $1/Q_l$, where $Q_l$ is the loaded Q of the probe, which may be sufficient for the imaging application. If more bandwidth is required, a broadband matching network similar to the one shown schematically in FIG. 9 may be used. In this figure, the source, represented by the current source $I_s$, conductance $G_s$, and inductance $L_s$, is coupled to the probe coil $L_p$ by the mutual inductance $M_s$. A two-section matching network ($L_2$ and $L_3$) is magnetically coupled to the probe coil and to the preamplifier. This network can be designed (using techniques which have been developed for unrelated impedance-matching and filtering applications) to yield a bandwidth which is 100 or more times larger than the probe bandwidth $1/Q_l$, at the price of additional loss of signal energy at the preamplifier. Because noise from the source is also suppressed, this results in no loss of performance unless the preamplifier noise or probe and matching network noise becomes dominant. FIG. 10 shows the calculated performance of the circuit shown in FIG. 9. In this case, a 100-fold broadening in bandwidth is obtained at a cost of 13 dB in signal strength. Low-loss matching sections $L_2$ and $L_3$ are required, which mandates that these also be superconductive. The matching sections can in fact be similar in structure to the probe coil, possibly coupled to the probe coil through apertures in superconductive planes as shown in FIG. 8.

The matching network (50) shown schematically in FIG. 8 consists of a probe coupling loop (56), two matching coils (58, 60), two conducting shields (62, 64), and an output coupling coil (66). The conducting shields (62, 64) adjust the degree of coupling between the matching coils by changing their mutual inductance. To minimize the loss in the matching network (50), all of the shields and matching coils are superconductive. The matching network (50) is coupled to the output, a preamplifier, through a normal (non-superconductive) output coupling coil (66).

Other applications of such a low loss inductor, and LC circuit, include switching RF power supplies, such as are used in RF heating systems. In addition to the low loss, these applications require that the inductor be capable of handling relatively large currents.

The requirement of a very low loss substrate makes the requirement for only a single superconductive layer even more critical. Sapphire, a single crystal form of alumina ($Al_2O_3$), has the lowest dielectric loss of any readily available substrate material. Sapphire is inexpensive, very stable mechanically, and available in a wide variety of shapes and sizes. Its thermal expansion coefficient, however, is poorly matched to those of the high temperature superconductors. As a result, superconducting films grown on sapphire substrates experience mechanical stress when thermally cycled. Thin films, up to a few hundred nanometers, can successfully withstand this stress, but the probability of damage to the superconducting properties of the film increases with the film thickness. If more than one layer of superconductor is required, the total thickness of the superconductive structure may exceed the critical thickness above which the superconductive properties degrade due to cracking or other types of mechanical failure.

Yet another advantage of this single layer design is the absence of crossovers. A structure in which one conducting layer passes over another without electrical connection is difficult to achieve epitaxially. In addition to the deposition and patterning of two conducting layers, an insulating layer deposition and patterning step is required. The complexity of this manufacturing process is much greater than for a process requiring only the deposition of a single conducting layer.

Figure 11:
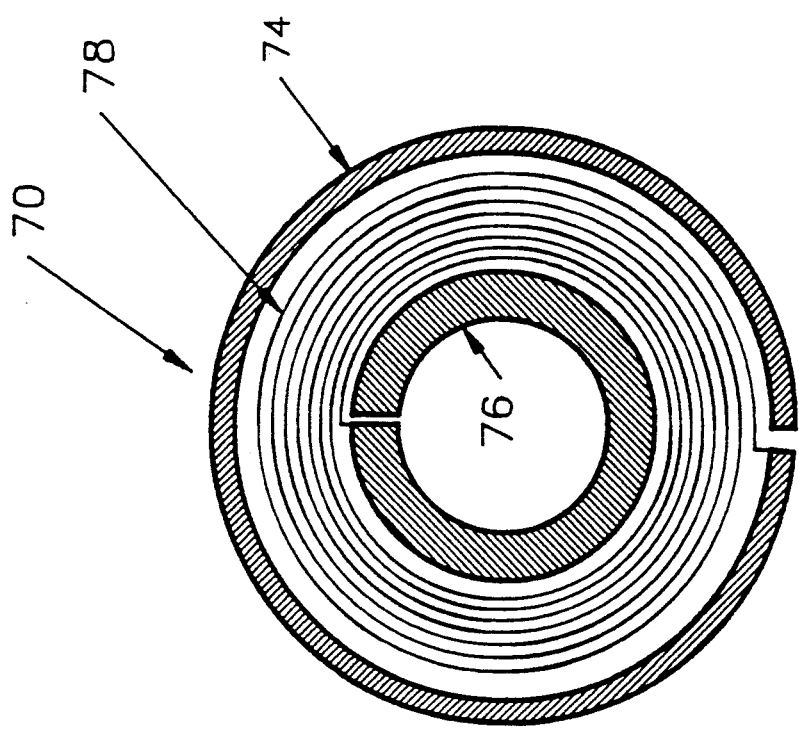
FIG. 11 is a schematic view of the pattern of superconductive material which forms one layer of the dual-film magnetic resonance probe coil.

A design for the second embodiment of this invention appears in FIG. 11. A coil (70), in most cases of the spiral type, is formed in a layer of superconductive material. Viewed from above, it has a right- or left-handed nature, i.e., as one traces the spiral outward, one moves in either a clockwise or a counterclockwise direction. Its inner and outer ends (76, 74) are terminated in relatively large electrodes, preferably in the form of circular arcs, which form the upper electrodes of two electrodes, the inner capacitive electrode (76) and the outer capacitive electrode (74). Between the two electrodes (74, 76) is the spiral inductor (78).

Figure 12:
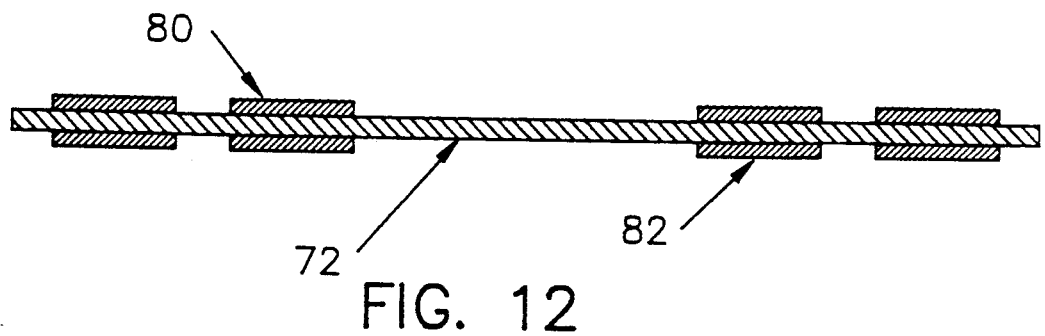
FIG. 12 shows a schematic partial cross-section of the dual-film magnetic resonance probe coil showing the active parts of the coil.

The top coil (80) is placed on the upper side of the dielectric layer (72), as shown in the cross-sectional view of FIG. 12. A bottom coil (82), also formed in a layer of superconductive material, is placed on the bottom of the dielectric (72). This coil (82) is patterned so that, viewed from above the superconductor-dielectric-superconductor stack (88) the top coil (80) and the bottom coil (82) have opposite handedness. This relative handedness is critical to the operation of the coil (70). The two coils (80, 82) are also patterned so that the electrode (74, 76) of both films face each other. It is critical that the electrodes (74, 76) face each other to ensure that the total inductance of the series combination of the two inductors (78) (connected in series by the two capacitors (90, 92) formed by the terminating electrodes (74, 76)) is nearly four times the inductance of a single layer.

Figure 13:
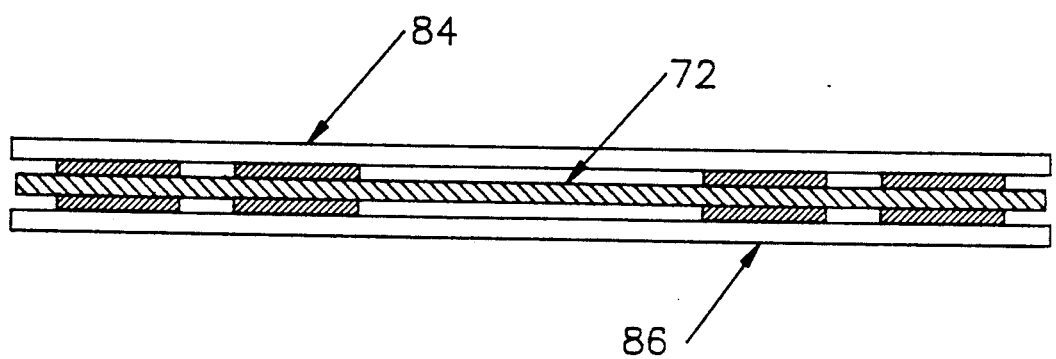
FIG. 13 shows a schematic cross-section of the dual-film magnetic resonance probe coil showing the active parts of the coil supported by their respective substrates.

Depending on the application, the superconducting films (80, 82) may be deposited on either side of the same dielectric (72), as shown in FIG. 12, or they may be deposited on separate substrates (84, 86) and then placed with the superconducting films (80, 82) in contact with either side of a dielectric layer (72), as shown in FIG. 13. When the films (80, 82) are deposited on either side of the same dielectric (72), the dielectric (72) is limited to those which are compatible with epitaxial deposition of the superconducting material. The resulting structure is physically robust since all of the interfaces are epitaxial, and is virtually immune to microphonic effects. Alternatively, when the superconducting films (80, 82) are deposited on separate substrates (84, 86) they are then placed against the dielectric layer and held in place by mechanical means. This structure allows separate optimization of the substrates (84, 86) and the dielectric (72). The substrates (84, 86) can be chosen for their compatibility with high-quality crystal growth of the superconducting material without regard to their dielectric loss tangents. The dielectric (72), on the other hand, can be a very thin layer of low-loss material, such as polytetrafluoroethylene, which is not necessarily compatible with superconductor processing.

Figure 14:
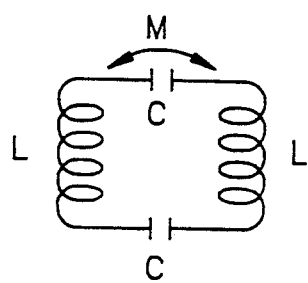
FIG. 14 is the equivalent circuit of the dual-film magnetic resonance probe coil.
Figure 14:
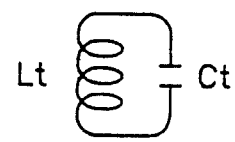

The equivalent circuit of the device is shown in FIG. 14(a). The self-inductance of each coil (80, 82) has the value L and the mutual inductance between the coils (80, 82) has the value M. In practice, the coils (80, 82) can be designed and located so the M is nearly equal to L, in which case the total circuit inductance $L_t$, as shown in the even simpler equivalent circuit of FIG. 14(b), is nearly 4L. In an optimized design the capacitance of each annular capacitor (90, 92) is made equal to C, so that the effective circuit capacitance shown in FIG. 14(b) as $C_t$ is equal to C/2. Thus the resonant frequency of the probe coil has a radian value of $\omega = (2LC)^{-0.5}$.

Figure 15:
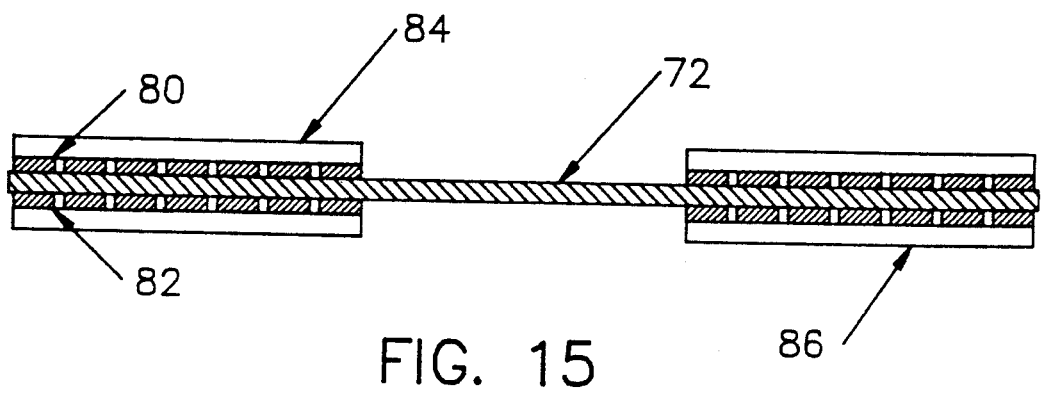
FIG. 15 is a schematic cross-section of the dual-film magnetic resonance probe coil where the substrates and superconductive films have been patterned to form an annulus.

FIG. 15 depicts a variation of the embodiment shown in FIG. 13. The substrate material has been removed from the center of the wafers, where it is not needed to support the superconducting films and where the magnetic field is intense. This is done because materials such as $LaAlO_3$ have a significant magnetic loss tangent, resulting in an avoidable increase in loss, and hence noise, in the circuit. The dielectric layer may also be removed from that circular region in the center to further reduce loss and noise. The spiral inductor patterns can be made to have lines which are much wider than the spaces between them, reducing the fringing magnetic field between the turns of the spirals. This would reduce even further the amount of magnetic energy within the substrates.

Figure 16:
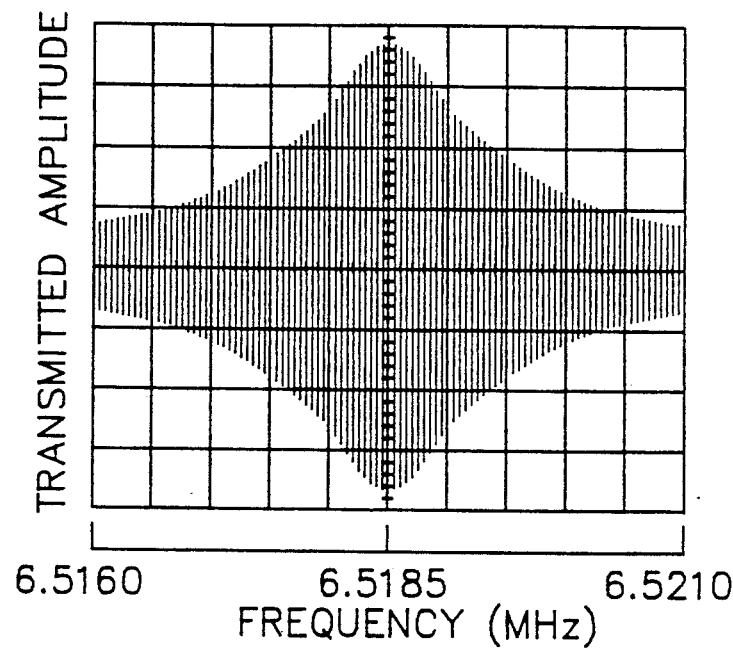
FIG. 16 shows the frequency response of the probe coil of FIG. 13, when the substrates are LaAlO$_3$, the coil is patterned in a thin film of YBa$_2$Cu$_3$O$_{7-\delta}$, and the intermediate dielectric is a sapphire wafer 0.012" thick.

FIG. 16 shows the performance of a probe coil as shown in FIG. 13. The substrates (84, 86) are $LaAlO_3$ 5 cm in diameter. The superconducting material is $YBa_2Cu_3O_{7-\delta}$, a high temperature superconductor. When the two superconducting films (80, 82) are placed in contact with either side of a sapphire wafer 0.012 inches thick, a quality factor of 14,000 at a fundamental resonant frequency of 6.52 MHz is observed.

Figure 17:
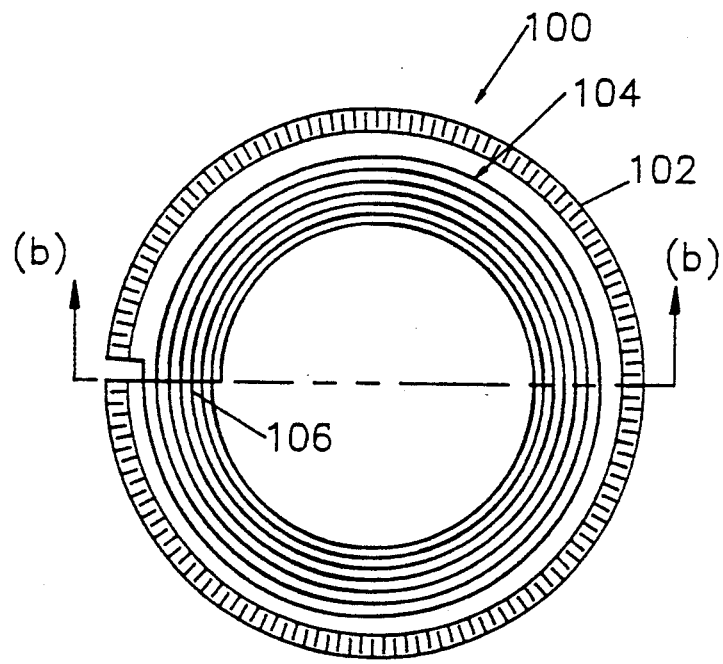
FIG. 17 is a schematic representation of a magnetic resonance probe coil employing the crossover design.
Figure 17:
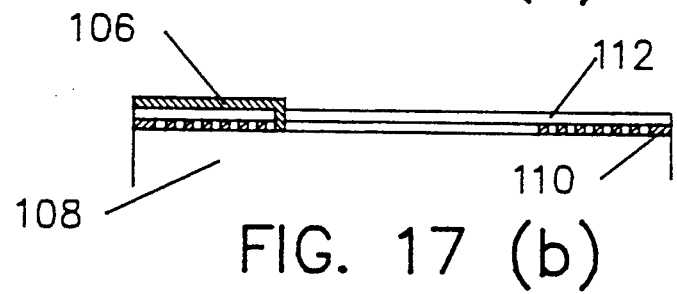

A third embodiment of the invention is shown in FIG. 17. The top view, FIG. 17(a) shows the crossover coil (100) consisting of an interdigitated capacitor (102), a spiral inductor (104), and a crossover lead (106) which electrically connects the inner and outer ends of the spiral inductor (104). The partial cross-section of FIG. 17(b) shows the layered nature of the structure. A first superconducting layer (110) is deposited on the substrate (108) and is subsequently patterned to form the capacitor (102) and the inductor (104). Next, a dielectric layer (112) is deposited. This layer may be patterned or may cover the entire surface of the wafer. Finally, a second superconductive layer (114) is deposited and patterned to form the crossover lead (106).

To maintain the desired quality factor, the crossover lead (106) must be formed of a superconductive material, but it need not be the same material as used for the first superconductive layer (110). The necessity of forming a second superconducting layer (114) atop the dielectric layer (112) places restraints on the material that can be used for the dielectric layer (112). It must combine a low dielectric loss tangent with physical characteristics, such as lattice parameter and chemical composition, that are compatible with the deposition of a high-quality layer of superconducting material. If the second superconducting layer (114) is a high-$T_c$ superconductor like $YBa_2Cu_3O_{7-\delta}$, then $CeO2$ is a good choice. The second superconductive layer (114) must be patterned to form a line between the inner and outer ends of the inductive spiral (104), since full coverage of the wafer with a conducting layer will interfere with the operation of the probe coil.

The primary part of the resonant sensor is the spiral inductor (104), consisting of several turns of a superconducting film (110). Using design techniques which are known to those skilled in the art, the inductor (104) can be designed to present the necessary effective area to the signal source, and its inductance L can be determined. In order to achieve resonance at the desired angular frequency $\omega = 1/sqrt(LC)$, an interdigital capacitor (102) with appropriate capacitance C is formed in an annular pattern around the perimeter of the inductor (104). The width of this annulus, and the width of and spacing between the interdigital fingers, is determined by design techniques known to those skilled in the art. In this preferred embodiment, the capacitor (102) is formed using the same superconducting film as the inductor (104). The inductor (104) and capacitor (102) are connected in parallel by connecting the outer turn of the inductor (104) to the inner terminal of the capacitor (102) and, by the use of a crossover (106) formed from a second superconducting layer (114), connecting the inner turn of the inductor (104) to the outer electrode of the capacitor (102).

In this preferred embodiment, the capacitor (102) is not a complete annulus, but rather a slit annulus, and the outer terminal of the inductor (104) is connected to one side of the inner annular terminal of the capacitor (102) in such a manner that, as shown in the figure, the direction (clockwise or counterclockwise) of current flow in the inner terminal of the capacitor (102) is the same as the sense of current flow in the inductor (104). Similarly, the inner terminal of the inductor (104) is connected to one side of the outer annular terminal of the capacitor (102) in the manner which results in the current flow in the outer terminal of the capacitor (102) having the same sense as that in the inductor (104). In this way, effective area and sensitivity of the device to external magnetic fields is maximized, and low resonant frequencies are achieved with larger geometries in the capacitor.

The crossover (106) may be formed from a second superconducting film (114) which is deposited after the deposition and patterning of the superconducting film (110) which forms the capacitor (102) and inductor (104) and the deposition and patterning of the insulating film (112) which separates the two superconductors (110, 114). Alternatively, it may actually be a crossunder which is deposited and patterned first, followed by the deposition and patterning of the insulating film, followed finally by the deposition and patterning of the second superconducting film, which forms the inductor and capacitor.

In the preferred embodiment, the superconducting films are high-temperature superconductors which possess low radio-frequency surface resistance at temperatures of 77 K. or above. These materials include YBaCuO, TlBaCaCuO, BiSrCaCuO, and related perovskite compounds. Deposition may be by sputtering, laser ablation, evaporation, or chemical vapor deposition.

The intervening dielectric layer may be $LaAlO_3$, $SrTiO_3$, MgO, $CeO_2$, or other materials or combinations of layers of these materials.

In one preferred embodiment, the first superconducting film is deposited by laser ablation and patterned to form the crossunder, which is a single line with a typical length of 1 to 3 cm. Laser ablation is chosen for this layer because it can produce smooth films (upon which subsequent layers can be deposited) over these small areas. The insulating film is also deposited by laser ablation and patterned. The second superconducting film is deposited by sputtering, which is used because this technique has been shown to be capable of producing low-surface-resistance films over the necessary large areas (perhaps 5 to 10 cm).

Transfer of the signals in the sensor to the signal processing, display, and recording systems may be achieved by means known to those skilled in the art. Ohmic contacts may be placed on the two terminals of the parallel LC circuit. Direct electrical connection may be made to the circuit through a capacitor of relatively low value, ensuring that the resonator is not excessively loaded, and the signals from the circuit applied to an appropriate low-noise amplifier. Alternatively, coupling to the circuit may be achieved inductively, perhaps to a small normal-metal coil which is external to the cryogenic enclosure of the circuit, or first to a superconducting broadband matching network (within the cryogenic enclosure) and then to a normal-metal coil.

OPERATIONAL DESCRIPTION

In practice the probe coil is placed between a source and an output device or signal processing electronics. The source may be biological tissue, a weld in an airplane wing, or any other object capable of producing an alternating magnetic field. When the frequency of the source magnetic field is far away from the resonant frequency of the probe coil, very little signal energy is transferred to the output. Near this resonant frequency, however, large currents are induced in the probe coil and are coupled to the output. Because the probe coil need not be physically connected to either the source or the output, only the probe coil (and matching network, if any) need be cooled.

Figure 7:
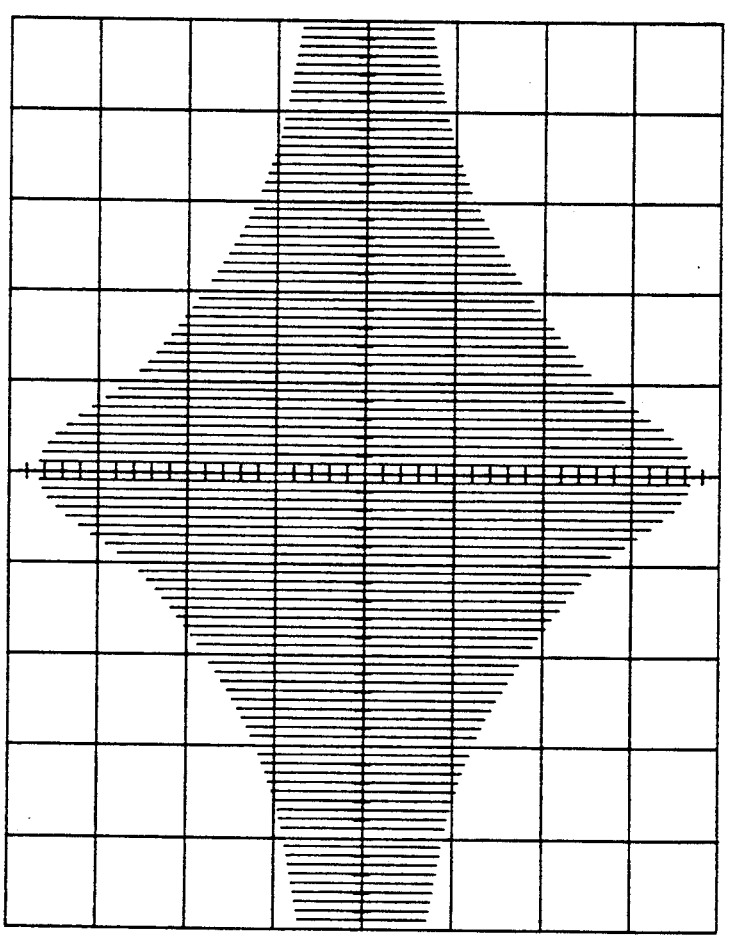
FIG. 7 shows the frequency response of the probe coil of FIG. 2, when the substrate is LaAlO$_3$ and the coil is patterned in a thin film of YBa$_2$Cu$_3$O$_{7-\delta}$.

FIG. 7 shows the behavior of the sensor shown in FIG. 2 across its fundamental resonant mode. This sensor was fabricated by epitaxially depositing $YBa_2Cu_3O_{7-\delta}$, a high temperature superconductor material with a critical temperature of about 90 K., onto a substrate of $LaAlO_3$. The superconductor film was then subjected to conventional photolithography to form the pattern shown in FIG. 2. One room temperature single loop coil, just external to the cryogenic enclosure holding the sensor in liquid nitrogen at approximately 77 K., was driven by a synthesized frequency source. A second coil on the far side of the enclosure was connected to an oscilloscope to function as the output. The signal from the second coil drives the y axis of the scope, while the frequency generated by the synthesizer drives the x axis. The quality factor (Q) is equal to the peak frequency (f) divided by the full width of the frequency response ($\Delta f$) measured at half the maximum power. FIG. 7 shows that a quality factor of approximately 10,000 was achieved at the fundamental frequency of 18.5 MHz (compared to the 15 MHz predicted by Equation 10 and 20 MHz predicted by Equations 5 and 6.). A second device of identical design had a similar Q at a fundamental resonant frequency of 18.7 MHz. It is suspected that this slightly higher frequency was the result of a few broken fingers in the capacitor. These experimental results clearly show that Q factors within the desired range are achievable. It is anticipated that even higher values of Q will be attained using substrates with lower dielectric loss, such as sapphire.

The dual-film magnetic resonance probe coil of FIG. 13 operates is a similar fashion. Again the probe coil (70) is coupled to a signal source and a preamplifier as described above. Here, however, the coupling to the source is necessarily inductive and the coupling to the preamplifier is preferably inductive, although it may be made directly through a series capacitor of small value or a parallel inductance of small value. Moreover, the probe coil may be broadband matched by the use of multiple coupled resonators, as described above. (Broadband, in this context, means greater in bandwidth than the resonant frequency divided by the quality factor of the probe.) In this case the matching resonators as well as the probe are two-coil, dual-film structures.

FIG. 16 shows the behavior of the sensor shown in FIG. 13 across its fundamental resonant mode. This sensor was fabricated by epitaxially depositing $YBa_2Cu_3O_{7-\delta}$, a high temperature superconductor material with a critical temperature of about 90 K., onto two substrates of $LaAlO_3$. The superconductor film was then subjected to conventional photolithography to form the pattern shown in FIG. 11. One room temperature single loop coil, just external to the cryogenic enclosure holding the sensor in liquid nitrogen at approximately 77 K., was driven by a synthesized frequency source. A second coil on the far side of the enclosure was connected to an oscilloscope to function as the output. The signal from the second coil drives the y axis of the scope, while the frequency generated by the synthesizer drives the x axis. The quality factor (Q) is equal to the peak frequency (f) divided by the full width of the frequency response ($\Delta f$) measured at half the maximum power. FIG. 16 shows that a quality factor of approximately 14,000 was achieved at the fundamental frequency of 6.52 MHz. These experimental results clearly show that Q factors within the desired range are achievable.

The probe coil of FIG. 17 operates in a similar fashion to that of FIG. 2, with the exception of the connection of the inner and outer ends of the inductive spiral. This connection increases the inductance of the device, thus decreasing the operating frequency of the probe coil. In this embodiment using an interdigital capacitor, it is necessary that the dielectric substrate upon which the circuit is built have sufficiently low loss. It is not clear that $LaAlO_3$ or YSZ, upon which such multilevel structures can be fabricated, has sufficiently low loss. Sapphire is known to possess such low loss, but its small thermal expansion coefficient makes it difficult to produce multilevel structures. Use of a very thin (0.1 micron) crossunder may be necessary, or alternative processes may be needed in order to produce the envisioned circuit.

CONCLUSION, RAMIFICATIONS AND SCOPE

It is thus apparent that the magnetic resonance probe coil of the present invention offers superior performance and greater ease of manufacturing than were heretofore available. The use of a superconductor for the probe coil offers unprecedented sensitivity. Much smaller signals can therefore be detected making the use of extremely high magnetic fields unnecessary. This in turn eases the requirement for cryogenic cooling subsystems in MRI systems. Instead of cooling a large bank of superconducting magnets, only a relatively small probe coil must be chilled. Furthermore, the use of high temperature superconductors relaxes the cooling requirements even more. Rather than expensive and unwieldy cooling equipment necessary for operating temperatures below 30 K., inexpensive and plentiful liquid nitrogen can be used.

Another advantage that this magnetic resonance probe coil offers is ease of manufacturing. In one preferred embodiment, the structure contains only one superconductive layer atop a substrate. Multiple deposition and patterning steps are avoided, as are possible mechanical instabilities associated with complex multilayer structures. This embodiment allows for moderately low operating frequencies.

A second embodiment also avoids the use of a crossover structure while operating at even lower frequencies. The dual-film design involves the deposition and patterning of only two layers of superconducting material. Depending on the engineering capabilities and economic considerations of the manufacturer this structure can be made by the deposition of the superconducting films on either side of a single dielectric, or by the deposition of two superconducting layers on separate substrates and their subsequent mounting in contact with an intervening dielectric layer.

A third embodiment is formed in a multilayer structure comprising two layers of superconducting material separated by a dielectric film. Manufacturers with mature multilayer deposition processes may find this the best way of obtaining very low frequency operation, since a trilayer structure is still rather simple to fabricate.

The extremely high quality factor of the probe even makes is possible to broaden the bandwidth by using a matching network. Because the cost of higher bandwidth is generally a matching loss, the bandwidth can only be broadened with a low-loss matching network and, perhaps more importantly, a low-noise preamplifier. This combination of the magnetic resonance probe coil of the present invention with the low-loss matching network described above, then, allows the flexibility of detecting very weak signals over a broad frequency range, while offering detection of extremely weak signals over a narrower range as long as the preamplifier has sufficiently low noise.

Other applications of such a low-loss inductor, and LC circuit, include switching RF power supplies, such as are used in RF heating systems. In addition to the low loss, these applications require that the inductor be capable of handling relatively large currents.

While the above description contains many specific details, these should not be construed as limitations on the scope of the invention, but rather as an exemplification of one of its preferred embodiments. Many other variations are possible and will no doubt occur to others upon reading and understanding the preceding description. Accordingly, the scope of the invention should be determined not by the embodiment illustrated, but by the appended claims and their legal equivalents.

What is claimed is:

1. A magnetic resonance probe coil, comprising:
   an inductive element in the form of a spiral of greater than one turn,
   a capacitive element, said inductive and capacitive elements formed from at least one thin layer of superconductive material, wherein said capacitive element is formed of a plurality of interdigitated electrodes extending between consecutive turns of said spiral.

2. The probe coil of claim 1 wherein said superconducting material is an oxide superconductor having a critical temperature greater than 30 K.

3. The probe coil of claim 2 wherein said inductive element and said capacitive element are formed of a thin film of said superconducting material deposited onto a planar substrate.

4. The probe coil of claim 1 having a resonant frequency.

5. The probe coil of claim 4 wherein said resonant frequency lies in the range of 1 to 1000 MHz.

6. The probe coil of claim 4 wherein said probe coil operates in self-resonant mode.

7. The probe coil of claim 1, wherein:
said inductive element is in the form of a spiral of approximately two turn, thus having an outer turn and an inner turn,
and said capacitive element is formed of a plurality of outer electrodes electrically connected to said outer turn, said outer electrodes radiating inwardly toward the center of said spiral, and a plurality of inner electrodes electrically connected to said inner turn, said inner electrodes radiating outwardly away from the center of said spiral, said inner electrodes interdigitating with said outer electrodes.

8. The probe coil of claim 7 wherein:
said outer electrodes are evenly distributed along said outer turn, and said inner electrodes are evenly distributed along said inner turn.

9. The probe coil of claim 1 wherein said spiral comprises a spiral of steadily decreasing diameter.

10. The probe coil of claim 1 wherein said spiral comprises a series of circular arcs interconnected to form a functional spiral.

11. The probe coil of claim 1 wherein said spiral comprises a series of line segments interconnected to form a functional spiral.

12. The probe coil of claim 1 wherein:
said inductive element is in the form of a spiral having a multiplicity of turns, and said capacitive element is formed of a plurality of interdigitated electrodes extending between consecutive turns of said spiral.

13. The probe coil of claim 12 wherein said plurality of interdigitated electrodes comprises:
a plurality of inner electrodes extending outward from the inner turn of each pair of consecutive turns of said spiral,
and a plurality of outer electrodes extending inward from the outer turn of each pair of consecutive turns of said spiral,
said inner electrodes interdigitating with said outer electrodes.

14. The probe coil of claim 1 further comprising at least one bonding pad for forming an electrical connection with said probe coil.

15. The probe coil of claim 1 further comprising a means for effectively coupling said probe coil to a preamplifier.

16. The probe coil of claim 15 wherein said means comprises a capacitive coupling between said probe coil and said preamplifier.

17. The probe coil of claim 15 wherein said means comprises an inductive coupling between said probe coil and said preamplifier.

18. The probe coil of claim 15 wherein said means comprises a broadband matching network which couples said probe coil to said preamplifier.

19. The probe coil of claim 18 wherein said probe coil has a loaded quality factor, and said broadband matching network couples said probe coil to said preamplifier over a fractional bandwidth substantially greater than the reciprocal of the loaded quality factor of said probe coil.

20. A magnetic resonance probe coil, comprising:
an inductive element in the form of a spiral of greater than one turn,
a capacitive element,
said inductive and capacitive elements formed from at least one thin layer of superconductive material, wherein
said inductive element consists of a spiral having more than one turn, said spiral having an inner end and an outer end;
said capacitive element is formed of a concentric electrode and a plurality of interdigitated electrodes,
said concentric electrode encircling said inductive element and said interdigitated electrodes extending between the outer turn of said spiral at said concentric electrode;
and wherein said inner end of said spiral is in electrical contact with said concentric electrode of said capacitive element.

21. A magnetic resonance probe coil, comprising:
an inductive element in the form of a spiral of greater than one turn,
a capacitive element,
said inductive and capacitive elements formed from at least one thin layer of superconductive material, wherein said inductive element is a first inductor and said capacitive element is a first capacitor, and further comprising
a dielectric layer having a top side and a bottom side;
a second inductor in the form of a spiral of greater than one turn,
each of said inductors having an inner end and an outer end;
a second capacitor,
each of said capacitors consisting of a first electrode and a second electrode;
wherein said first electrode of said first capacitor is formed from the same thin layer of superconductive material as and is connected to said inner end of said first inductor, and said first electrode of said second capacitor is formed from the same thin layer of superconductive material as and is connected to said outer end of said first inductor,
and wherein said second electrode of said first capacitor is formed from the same thin layer of superconductive material as and is connected to said inner end of said second inductor, and said second electrode of said second capacitor is formed from the same thin layer of superconductive material as and is connected to said outer end of said second inductor,
and wherein said dielectric is interposed between said first and second inductors and between said first and second electrodes of said first and second capacitors.

* * * * *

UNITED STATES PATENT AND TRADEMARK OFFICE
CERTIFICATE OF CORRECTION

PATENT NO. : 5,276,398
DATED : January 4, 1994
INVENTOR(S) : Withers, et al.

It is certified that error appears in the above-indentified patent and that said Letters Patent is hereby corrected as shown below:

In the drawings, Sheet 4, Figure 8, Reference Number 66 should be applied to the output coupling coil at the center-bottom of the figure.

Signed and Sealed this

Thirteenth Day of September, 1994

Attest:

BRUCE LEHMAN

Attesting Officer           *Commissioner of Patents and Trademarks*